(12) United States Patent
Jiang (10) Patent No.: US 10,629,720 B2
(45) Date of Patent: Apr. 21, 2020

(54) LAYERED VERTICAL FIELD EFFECT TRANSISTOR AND METHODS OF FABRICATION

(71) Applicant: Quanzhong Jiang, Coventry (GB)

(72) Inventor: Quanzhong Jiang, Coventry (GB)

( * ) Notice: Subject to any disclaimer, the term of this patent is extended or adjusted under 35 U.S.C. 154(b) by 2 days.

(21) Appl. No.: 16/070,754

(22) PCT Filed: Feb. 8, 2017

(86) PCT No.: PCT/GB2017/050316
§ 371 (c)(1),
(2) Date: Jul. 17, 2018

(87) PCT Pub. No.: WO2017/144852
PCT Pub. Date: Aug. 31, 2017

(65) Prior Publication Data
US 2019/0334024 A1    Oct. 31, 2019

(30) Foreign Application Priority Data
Feb. 24, 2016    (GB) .................................. 1603187.4

(51) Int. Cl.
*H01L 29/778*   (2006.01)
*H01L 21/02*    (2006.01)
(Continued)

(52) U.S. Cl.
CPC ...... *H01L 29/7788* (2013.01); *H01L 21/0254* (2013.01); *H01L 21/02458* (2013.01);
(Continued)

(58) Field of Classification Search
CPC ........... H01L 21/02647; H01L 29/7789; H01L 29/66446; H01L 21/02642; H01L 29/7788
See application file for complete search history.

(56) References Cited

U.S. PATENT DOCUMENTS

2006/0124962 A1    6/2006    Ueda et al.
2006/0220060 A1    10/2006   Nakata et al.
(Continued)

OTHER PUBLICATIONS

International Search Report & Written Opinion dated May 22, 2017 from PCT Application No. PCT/GB2017/050316.

*Primary Examiner* — Cuong Q Nguyen
*Assistant Examiner* — Shih Tsun A Chou
(74) *Attorney, Agent, or Firm* — Innovation Capital Law Group, LLP; Vic Lin (57) ABSTRACT

A III-nitride vertical field effect transistor comprises a base plate; a mask layer overlaying said base plate and having opening windows for partial exposure of said base plate; a drain grown epitaxially onto regions of said base plate exposed by the opening windows of said mask layer; an insulation layer grown epitaxially onto said drain; a source grown epitaxially onto said insulation layer; a vertical nitride stack grown epitaxially onto the side faces of said drain, said insulation layer and said source, overlaying said mask layer and providing at least one vertical conducting channel to connect said source to said drain; a current flowing from source to said drain through a conducting channel can be modulated by an electrical voltage that is applied to the side face of said vertical nitride stack. There are preferably also electrodes and edge terms.

11 Claims, 7 Drawing Sheets

(51) Int. Cl.
*H01L 29/20* (2006.01)
*H01L 29/423* (2006.01)
*H01L 29/66* (2006.01)

(52) U.S. Cl.
CPC .. *H01L 21/02576* (2013.01); *H01L 21/02579* (2013.01); *H01L 21/02642* (2013.01); *H01L 21/02647* (2013.01); *H01L 29/2003* (2013.01); *H01L 29/42364* (2013.01); *H01L 29/42372* (2013.01); *H01L 29/66446* (2013.01)

(56) References Cited

U.S. PATENT DOCUMENTS

2013/0248876 A1* 9/2013 Yaegashi ............. H01L 29/0649
257/76
2015/0014700 A1* 1/2015 Khalil ................. H01L 29/7788
257/76

* cited by examiner

LAYERED VERTICAL FIELD EFFECT TRANSISTOR AND METHODS OF FABRICATION

1. FIELD OF THE INVENTION

The present invention relates to the field of layered semiconductor devices and their methods of manufacture.

2. BACKGROUND

Power electronics transistors are widely used in a variety of applications such as mobile phone network, solar farms and electrical cars to modify the waveform of electricity, for example, from dc (direct current) to ac (alternating current) or from one voltage level to another. These transistors need to operate over a wide range of power levels, from milliwatts in mobile handsets to hundreds of megawatts in a high-voltage power transmission system, and at different frequencies for a radio frequency to microwave and mm-waves. In spite of the progress made in the production of these transistors with a handful of materials such as Si, SiC, arsenide and III-nitrides (GaN, AlN, InGaN, AlGaN etc), the devices have pros and cons. Particularly, the available devices lack the abilities of operating at a high-voltage (>1 KV) and a high energy density with a low loss.

Particularly, the 21st century has brought challenges to the human race in decarbonising power grids that consume fossil fuels or radioactive materials. To date, the mass production of purified Si material and silicon solar cells has significantly reduced the costs of solar panels, with solar farms supplying energy to global power grids awaiting on the horizon. The dc power generated by solar farms must be changed efficiently into 3-phase ac with electronic circuits, known as invertors, or the voltage has to be increased to up to 1200V with convertors to reduce the current flow so that Joule heating can be minimised. In recent years, similar invertors and convertors also have been sought urgently for the regulation of power in electric vehicles (EV) and solar airplanes. These convert the low DC voltage of batteries (<40 V) to more than 1 KV, or invert a DC voltage to 3-phase AC to drive an electrical motor. For electric vehicles, these circuits can account for a quarter of all costs.

The efficiency of these convertors or inverters is limited by the transistors that act as switches. These transistors have to meet these requirements: 1) low energy loss that makes solar farms more cost-effective or enables cars or solar planes to travel for longer distances; 2) high breakdown voltage; 3) robustness and thermal stability in harsh operating environments; 4) built-in mechanisms for heat dissipation.

However, these transistors available in the market have never been ideal. 1) Si insulated gate bipolar transistors (IGBTs) have been widely used in inverter/converter modules. However, a high percentage of energy loss (>15%), a low breakdown voltage and a low switching rate are the major disadvantages. 2) Transistors made of wide-bandgap SiC (band gap: 3.26 eV) are the state of the arts to date. But the growth technology for SiC has never been mature and the wafer cost is expected to be at the same level (typically ~400 USD/wafer, 2"; or 2000 USD/wafer, 4")/ Also, the wafers contain defects such as micro-pipes and hollow tubes that are regarded as the killer defects for SiC high-power and high-voltage transistors.

III-nitrides such as AlN and GaN have properties similar to those of SiC, which include wide band-gaps, good thermal conductivities and high electrical strengths. But they are different from SiC. They are polar materials and have spontaneous polarizations along one direction known as C axis. So, for a thin piece of III-nitride having C-axis as its surface normal, its top C-plane and bottom C-plane are not equivalent. Technically, one is referred as III-polar face (hereafter III-face or (0001) plane, such as Ga-face for GaN) and the other is referred as nitrogen-polar face ((000-1) plane or N-face). But when C-axis is parallel to a thin piece of wafer, the wafer is known as non-polar III-nitride and hence C-plane, III-face and N-face are parallel to the surface normal.

At a hetero-junction of two different C-plane III-nitrides such as $Al_{0.25}Ga_{0.75}N/GaN$ and $In_{0.36}Al_{0.64}N/GaN$, there are discontinuities in energy band and polarization. These discontinuities can lead to both a charge transport channel of a high electron mobility and a two-dimensional electron gas (2DEG) that can be modulated by an electrical field. So, they have been employed for forming field-effect transistors (FET), which is also known as high-electron mobility transistors (HEMTs) that operate at a current density of ~1 A/mm. But the operating voltage of these transistors is in general low (<700 V). So attempts have been made to increase the breakdown with vertical structure designs.

Okada et al demonstrated a vertical structure with a conducting 2DEG channel on a tilted C-plane on a Ga-polar GaN substrate. But the conductive channel contains steps that are formed on a tilted C-plane during growth. So, the electron mobility of the channel is reduced. Therefore, a high resistance is reported. Also, a current aperture vertical electron transistor (CAVET) has been proposed and demonstrated by Ben-Yaacov et al and later by Kanechika et al with a horizontal 2DEG forming a part of the channel. The source region consists of an AlGaN/GaN hetero-junction (i.e. 2DEG), and is separated vertically from the drain region by an insulation III-nitride layer. The insulation layer contains an vertical aperture that is filled with a conductive material such as Si:GaN, the same as the drain region. Therefore, electrons can flow from the source along the 2DEG, through the aperture, and collected at the drain. A gate, that is located directly above the aperture and larger than the aperture, is used to modulate the charge in the 2DEG conducting channel to control the amount of current that passes through the aperture. But these transistors often exhibit internal current leaks that cause device breakdown since the aperture is formed on ICP (inductive coupled plasma) etching surfaces. Further, it is obvious that such a 2DEG can be arranged vertically on the III-face or N-faces of a non-polar template (i.e. C direction is horizontal), as proposed by Khalil et al (Pub. NO.: US 2015/0014700 A1), solely as a conductive channel from the gate to the drain.

There are also designs that employ the high electron mobility of bulk nitride materials. These include GaN junction field effect transistors (JFET) and vertical GaN trench metaloxide-semiconductor field-effect transistor (MOSFET). These devices have a high operating voltage that benefits from the vertical design. But, the electron mobility is reduced to the electron mobility of bulk GaN and as a result, the device resistance is increased. Hence, a significant energy loss is expected. However, the high electron mobility of InGaN has yet to be exploited.

But there are plenty of issues with those prior arts:

First of all, the formation of these transistors often involves MOVPE (Metal Organic Vapour Phase Epitaxy) or MBE (Molecular Beam Epitaxy) growth of III-nitride on plasma- or chemically-etched surfaces. Consequently, the resulting devices will have a high density of defects that reduce electron mobility and increase current leak.

Secondly, GaN and AlN wafers are really rare and expensive (~500 USD/cm$^2$), and they cannot meet the demand of the industry. So, low-cost templates such as GaN/sapphire or GaN/SiC have to be used. However, these templates often have a high level of defects that must be avoided in forming high-quality devices.

Thirdly, the existing device designs involve the formation of a current pass connection from a highly-conductive, narrow 2DEG conducting channel (a few nanometer in width) to a less-conductive n-type Si:GaN bulk body. Consequently, "hotspots" are created during operation, which could cause device breakdown.

Finally and importantly, for FETs with 2DEG, in an off-state, there is a huge electrical field formed at the gate edge of drain side, which induces device breakdown through surface defects. Such an electrical field must be shifted to a region where dielectric strength is high.

Epitaxial lateral overgrowth (ELOG) (in some literature, it is known as lateral epitaxial overgrowth (LEO)) has been well-known for the reduction of defects in III-nitrides. It involves the use of a mask layer such as SO$_2$ or Si$_x$N as growth mask. Such a layer is patterned to form opening windows to expose the surface of a III-nitride template. So, during growth, III-nitride first grows inside the opening windows, then grows not only vertically, but also laterally overlaying the growth mask. Since the mask blocks the passes of defects, the III-nitride growing over a mask has a much reduced defect density. This technology has been successfully used in Blu-Ray laser diodes. However, it has not been used for the formation of high-quality transistor because a useful transistor comprises regions of different electrical properties. For example, the drain and the source of a transistor must be conductive; the material between them must be very resistive and another material that is used to connect them must have high electron mobility. Therefore, it requires a tailored growth process to avoid "cross-deposition", i.e. resistive material should not be inserted into a current pass or conductive material cannot be a part of an insulation layer. The former will increase the serial resistance locally to result in a hot spot that could cause transistor breakdown and the latter will cause a leakage current, i.e. a transistor cannot be turned off. Further, since ELOG growth can only offer a small quantity of materials, incorporating them into a transistor requires a thorough consideration.

Therefore, it would be desirable to be able to address at least some of the above difficulties through comprehensive structure design in accordance with growth and manufacture procedures.

3. SUMMARY

A first aspect of the present invention provides a III-nitride vertical field effect transistor (VFET) comprising:
a base plate;
a mask layer overlaying said base plate and having opening windows for partial exposure of said base plate;
a drain grown epitaxially from the opening windows of said mask layer onto said base plate, said drain having a top surface and a side face;
  an insulation layer grown epitaxially onto said drain top surface, said insulation layer having a top surface and a side face;
  a source grown epitaxially onto said insulation layer top surface, said source having a top surface and a side face;
a vertical nitride stack grown epitaxially onto the side face of said drain, said insulation layer and said source, such that the stack overlies said mask layer, the stack providing a conducting channel connecting said source and said drain.

Electrons are only allowed to flow between said source and said drain through one or more conducting channels that are provided by said vertical nitride stack, and the quantity of an electron flow is modulated by a voltage that is applied to said vertical nitride stack.

Although said base plate can be such foreign substrates sapphire, SiC, diamond, Si, etc., which can be used for the epitaxial growth of III-nitride, it is advantageous to use templates that have a III-nitride layer of a high-quality.

According to some embodiments of this invention, said base plate comprises free-standing (FS) n-type III-nitride wafers, such as AlN, and Si-doped or Ge-doped GaN (doping concentration: $1 \times 10^{17}$ cm$^{-3}$ to $3 \times 10^{20}$ cm$^{-3}$). So, a drain electrode can be placed on either side of wafers and these templates have desired thermal conductivity. However, they are rare and expensive.

According to some embodiments of this invention, said base plate is a template that is formed by epitaxial growth or bonding onto such substrates as sapphire, Si, SiC, Mo, diamond and AlN etc, and comprises at least one conductive layer of 200 nm to 10 μm thick as a seeding layer, such as n-type Si- or Ge-doped In$_y$Al$_x$Ga$_{1-x-y}$N (0≤y≤0.4, 0≤x≤0.2, doping concentration: $1 \times 10^{17}$ cm$^{-3}$ to $3 \times 10^{20}$ cm$^{-3}$). In this case, drain electrodes and devices have to be placed on the top side of said base plate. Further, these templates have a high density of defects such as dislocations (~$10^{+6}$ to $10^{+9}$ cm$^{-2}$), which are able to degrade the quality of a device. Therefore, epitaxial lateral overgrowth (ELOG) would be adopted by employing said mask layer to prevent the defects from penetrating said vertical nitride stack to have a high-quality conducting channel.

According to some embodiments of this invention, said mask layer comprises at least one of such materials as SiO$_2$, Si$_x$N, Ti, W, spin-on-glass, spin-on-dielectrics and flowable oxide etc. and opening rectangular windows with both dimensions from 5 μm to 500 μm. In order to perform efficient ELOG, one of the edges of the opening windows is parallel with one of the vertical crystallographic planes of a high lateral growth rate. For C-plane nitride base plate, one of the edges of the opening windows should be along [1-100] that is parallel to a-plane i.e. [11-20]. It has a large lateral growth rate at a high growth temperature and a high NH$_3$ flow. For non-polar nitride base plate, one of the edges of the opening windows should be parallel to vertical C-plane not only for a high lateral growth rate but also for the formation of a vertical 2DEG conducting channel. However, in order to mitigate hexagonal defects appearing on the N-face growing on a non-polar template, the edge of the opening windows is intentionally mis-oriented by an angle of less than 10° away from the direction that is in parallel with C-plane.

During the epitaxial growth of the embodiments, said mask layer acts as a growth mask, i.e. no significant deposition of III-nitride materials occurs on it. Further, as an integrated part of a transistor, it separates the gate electrode region from the drain for a safe operation.

According to some embodiments of this invention, said drain emerges from said mask layer by at least 100 nm to allow a conduction channel to be connected to said drain.

According to some embodiments of this invention, said drain comprises at least one of conductive n-type doped In$_y$Al$_x$Ga$_{1-x-y}$N layers (0≤y≤0.4, 0≤x≤0.4, Si or Ge doping concentration: $1 \times 10^{17}$ cm$^{-3}$ to $3 \times 10^{20}$ cm$^{-3}$), and has a thickness between 200 nm to 10 μm. III-nitrides that contains Indium are more attractive since they have a larger electron mobility. Consequently, a thinner conductive layer may be used to reduce the actual thickness of mask layer during growth. According to some embodiments of this invention, said drain overlays said mask layer partially, i.e. ELOG occurs during the growth of said drain.

According to some embodiments of this invention, when said drain and said insulation layer are different III-nitride materials, there is a graded layer between them, which changes either in steps or continuously from the composition of the drain to that of the insulation layer. If it is n-type doped (Si or Ge doping concentration: $1\times10^{17}$ cm$^{-3}$ to $3\times10^{20}$ cm$^{-3}$), it is clarified as a part of said drain. Otherwise, it is clarified as a part of insulation layer. Such a graded layer reduces the possibility of forming dislocations, and, in some case, extends a 2DEG channel into said drain to avoid "hotspots".

According to some embodiments of this invention, said insulation layer comprises at least one of $In_yAl_xGa_{1-x-y}N$ where $0 \le y \le 0.1$ and $0 \le x \le 1$, and has a resistivity of at least 10 Ω·cm and a thickness between 200 nm to 20 μm. In general, a high resistivity will lead to a small current leak through said insulation layer, and a thick insulation layer will give rise to a high operation voltage.

According to some embodiments of this invention, said insulation layer comprises at least one p-type doped III-nitride (p-doping concentration: $1\times10^{16}$ cm$^{-3}$ to $3\times10^{20}$ cm$^{-3}$). The dopants including Mg, C, Fe et al. P-type doping serves two purposes: 1) increasing the resistivity of said insulation layer. The unintentionally-doped III-nitrides are N-type and have a background electron concentration that can be neutralized through p-type doping; 2) depleting locally the free electrons in a conducting channel to form normally-off transistors, since a p-type doped layer in said insulation layer can form a diode with said vertical nitride stack.

According to some embodiments of this invention, said source comprises at least one of $In_yAl_xGa_{1-x-y}N$ where $0-y \le 0.4$ and $0 \le x \le 0.2$, and has a thickness of 200 nm to 10 μm and a n-type doping concentration of $1\times10^{17}$ cm$^{-3}$ to $3\times10^{20}$ cm$^{-3}$. The dopants include Si and/or Ge.

According to some embodiments of this invention, when said source and said insulation layer are different III-nitride materials, there is a graded layer between them, which changes either in steps or continuously from the composition of said insulation layer to that of said source. If it is n-type doped (Si or Ge doping concentration: at least $1\times10^{17}$ cm$^{-3}$), it is clarified as a part of said source. Otherwise, it is clarified as a part of insulation layer. Such a graded layer reduces the possibility of forming dislocations, and, in some case, extends a 2DEG channel into the source to avoid "hotspots".

According to some embodiments of this invention, said vertical III-nitride stack comprises at least one layer of $In_yAl_xGa_{1-x-y}N$ where $0 \le y \le 0.4$, $0 \le x \le 1$, thickness: 10 nm to 300 nm, onto the side faces of said drain, said source and said insulation layer. It serves such purposes as optimising surface morphology of the side faces, acting as a conducting channel, forming 2DEG conducting channel between them or with the side faces or optimising the properties of a conducting channel.

According to some embodiments of this invention, said vertical nitride stack comprises at least one of $In_xGa_{1-x}N$ where $0 \le x \le 0.4$ as a conducting channel, which has a thickness of 200 nm to 2000 nm and a n-type doping concentration of $1\times10^{17}$ cm$^{-3}$ to $3\times10^{20}$ cm$^{-3}$. The dopants may comprise Si and/or Ge.

According to some embodiments of this invention, said vertical nitride stack provides at least one 2-dimensional electron gas conducting channel by comprising at least one layer of $In_yAl_xGa_{1-x-y}N$ where $0 \le y \le 0.4$, $0 \le x \le 1$ and 0.5 nm to 100 nm in thickness, when said drain, said insulation layer and said source comprise non-polar nitride layers.

According to some embodiments of this invention, said vertical III-nitride stack comprises a layer of AlN (thickness: 0.5 nm to 2 nm) next to a 2-dimensional electron gas conducting channel to mitigate so-called "alloy scattering" to maintain a high electron mobility.

According to some embodiments of this invention, on a III-face of non-polar nitride and for the formation of a 2DEG conducting channel, said vertical nitride stack comprises at least one layer of $In_yAl_xGa_{1-x-y}N$ where $0 \le y \le 0.4$, $0.1 \le x \le 1$, whose thickness is between 5 nm to 100 nm. Such a layer is known as a barrier. For example, if said drain, said insulation layer and said source are GaN and said vertical nitride stack is $Al_{0.23}Ga_{0.77}N$ or $AlN/Al_{0.23}Ga_{0.77}N$, a 2DEG is formed at their interface.

According to some embodiments of this invention, on a N-face of non-polar nitride and for the formation of a 2DEG conducting channel, said vertical III-nitride stack comprises at least one layer of $In_xGa_{1-x}N$, where $0 \le x \le 0.4$ and is of 2 nm-100 nm thick. Such a layer is known as a channel layer in which the 2DEG channel resides. For example, if said drain and said source are Si:GaN, said insulation layer is $Al_{0.23}Ga_{0.77}N$ and said vertical nitride stack is GaN or AlN/GaN, a 2DEG is formed at their interface.

According to some embodiments of this invention, resulting 2DEG conducting channel comprises free electrons. The devices are referred as normally-on transistors.

According to some embodiments of this invention, free electrons in said 2DEG conductive channel are fully or locally depleted. The devices are referred as normally-off transistors.

According to some embodiments of this invention, said vertical III-nitride stack comprises a p-type doped III-nitride layer (10 nm-400 nm, doping concentration: $8\times10^{17}$ cm$^3$ to $8\times10^{20}$ cm$^{-3}$). The p-type dope III-nitride layer is able to deplete the free electrons in the 2DEG conductive channel to form normally-off transistors. The 2DEG can be recovered by applying a positive voltage to said vertical III-nitride stack.

To operate, there are also associated parts such as edge terms to reduce surface leakage current, a drain electrode on the base plate, a source electrode on top of the source and a gate electrode (or a gate) on the vertical nitride stack.

Some benefits are achieved by way of the present invention over the available techniques.

First of all, in addition to an operation voltage offered by vertical multilayer structure, a high current density (up to 1 A/mm) and a small resistance offered by a 2DEG channel, this invention provides a new vertical device design that involves using a mask layer. It not only separates the drain region from the source and the gate region, but also accommodates a growth process to allow ELOG growth to occur so that a conducting channel will not inherit defects from said base plate. As a result of this, the conducting channel will have an optimised electron mobility. So, the resulting transistors have less energy loss in operation.

Secondly, a conducting channel can overlay both a drain and a source from the backsides with a significant length. Consequently, hot spots, which are formed when a conducting channel is directly connected to a drain or a source, are avoided.

Thirdly and most importantly, there has been a problem with the application of a 2DEG conducting channel when electrode connections for a source, a gate and a drain are on the same side of a substrate; during a high voltage operation (>200 V), a high electrical field occurs at the gate edge of the drain side, and such an electrical field limits the operation voltage to less than 650V. This has made III-nitride transistors less competitive with those made with SiC. The embodiments of this invention have drain and source structures on the back side of a 2DEG conducting channel whilst a gate electrode is on the front side. Consequently, the electrical fields at the gate edges are buried inside said insulation layer. Therefore, they can operate at a voltage of >650 V.

Fourthly, for safety, switching devices are preferably normally-off. Normally-off III-nitride transistors have been suffering from instability and drops in conductivity. For the embodiments of this invention, the insulation layer can comprise a thin p-doped layer that forms a diode locally with the vertical nitride stack to deplete the electrons of short vertical region. This will lead to stable and high-threshold normally-off transistors.

Fifthly, prior arts on III-nitride vertical transistors involve regrowth of a conducting channel or materials on ICP etched nitride surface, which are of poor quality and often cause unwanted current leakage.

Finally, with this structure design, it is easy to introduce heat sink at low cost such as copper or diamond, which can be clamped or deposited onto side faces. Therefore, low-cost GaN-on-sapphire templates can be used and low-cost transistors will be available at industrial scale.

A second aspect of this invention provides a method of fabricating layered VFET comprising:
providing a base plate;
disposing a mask layer overlaying said base plate and having opening windows for partial exposure of said base plate;
growing a drain epitaxially from the opening windows of said mask layer onto said base plate;
growing an insulation layer epitaxially onto said drain;
growing a source epitaxially onto said insulation layer; and
growing a vertical nitride stack epitaxially onto side faces of said drain, said insulation layer and said source, which overlays said mask layer and provides at least one vertical conducting channel to connect said source to said drain.

For some embodiments of this invention, the transistor structures are grown with MOVPE or MBE onto said base plate such as free-standing (FS) n-type GaN substrates doped with Si or Ge. Alternatives are the templates comprising at least one of conductive n-type $In_yAl_xGa_{1-x-y}N$ ($0 \leq y \leq 0.2$, $0 \leq x \leq 0.4$, 200 nm to 10 µm thick) grown on such substrates as AlN, sapphire, Si and SiC et al. FS GaN or AlN, are advantageous, but they are expensive. However, other templates often have a high level of defects.

For some embodiments of this invention, said mask layer comprises at least one of such materials as $Si_xN$, $Si_2O$, flowable oxide, spin-on-glass, spin-on-dielectrics, Ti, W, or these materials grown at different conditions to have different etching rates.

The challenge in forming the embodiments of this invention is to avoid so-called "cross-deposition" in growing said drain, said insulation layer and said source, which have different electrical conducting properties. In detail, during the growth of said insulation layer, growth on the side face of said drain should be minimized or totally avoided since the insulation layer on the side face of the drain will increase serial resistance. In another case, during the growth of said source that comprises conductive nitride, growth of conductive materials on the side face of said insulation layer should be minimized or totally avoided since a conducting layer on the side face of the insulation layer will cause current leakage, unless it is a part of a conducting channel. Although cross-deposition can be minimized by encouraging vertical growth with such growth conditions as a relatively low temperature, a relatively high pressure or a relatively low $NH_3$ flow, it should eradicate during growth through tailored growth processes.

For some embodiments of this invention, growth interruption occurs after growing said drain, or after growing said insulation layer to allow already-grown side face covered with at least one of $SiO_2$, $Si_xN$, spin-on-glass, spin-on-dielectric, Ti, W, carbon and flowable oxide as growth masks to avoid cross-deposition. This involves multiple growth steps and hence the cost will be high.

For some embodiments of this invention, said mask layer for growth is much thick than that for a device to allow said source and said insulation layer to grow totally inside a thick growth mask. So, the growth mask will be thinned before the deposition of said vertical nitride stack.

Figure 1:
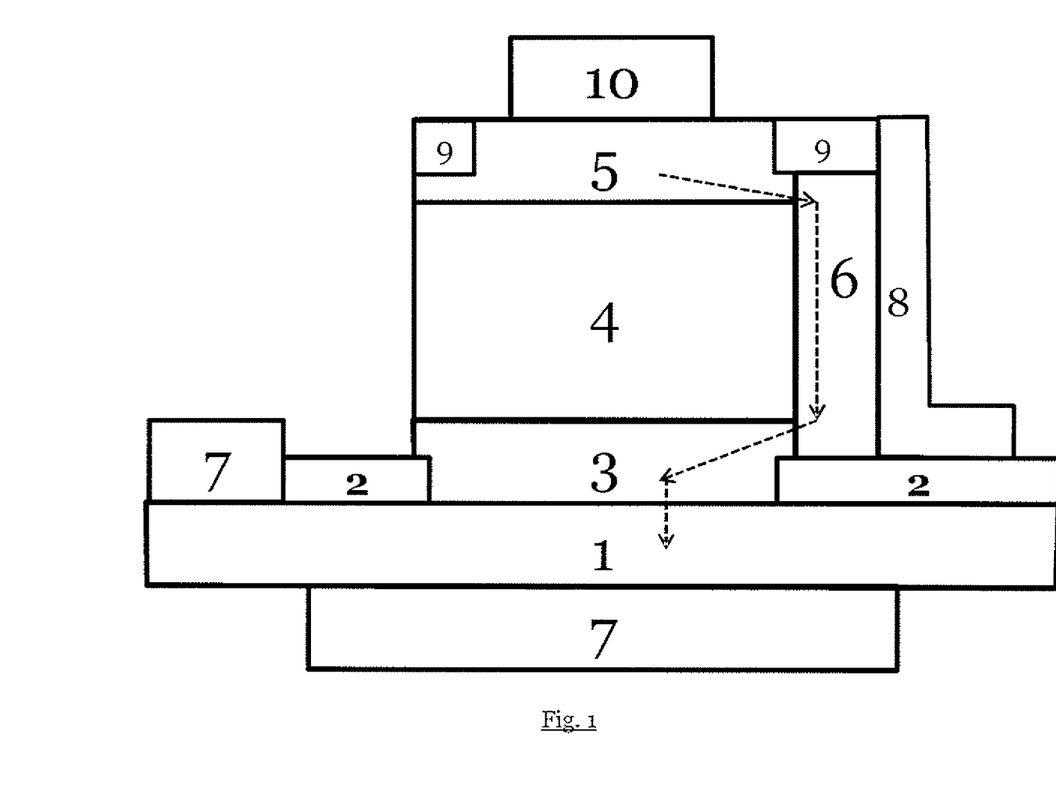
FIG. 1 schematically shows across-section of a III-nitride vertical field effect transistor in accordance with an embodiment of the present invention, comprising: base plate (1); mask layer (2); drain (3); insulation layer (4); source (5); vertical nitride stack (6); drain electrode (7); gate electrode (8); edge terms (9); source electrode (10). (Arrows indicate electron flow direction).
Figure 2:
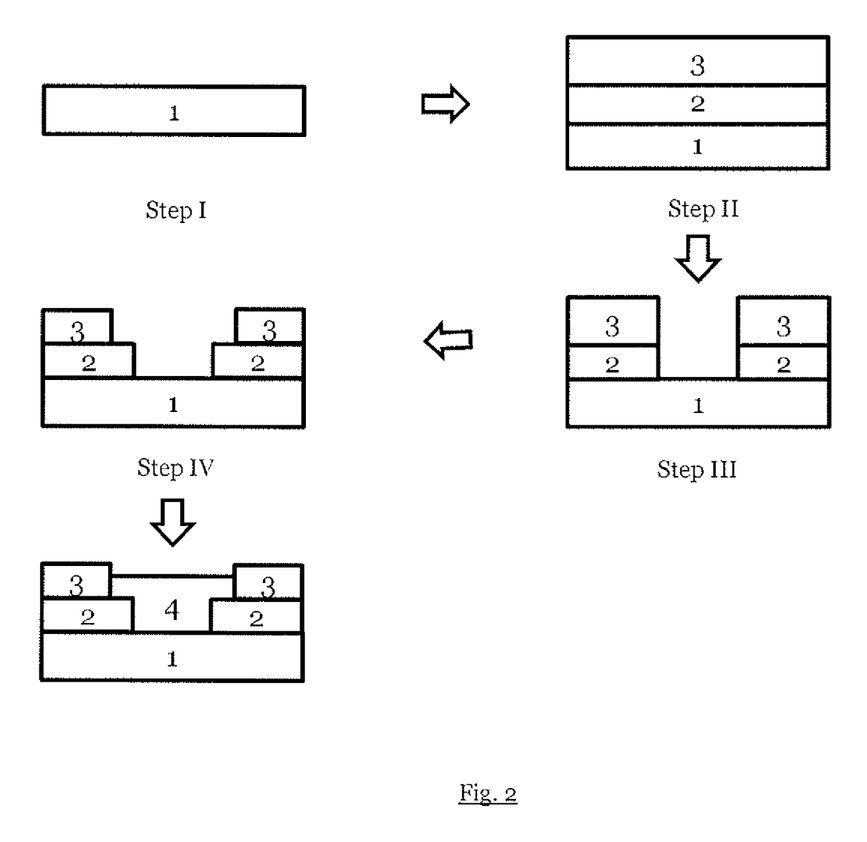
FIG. 2 schematically shows a process for forming a double width growth mask that allows ELOG growth to occur within it: base plate (1); bottom mask layer (2); top mask layer (3) and III-nitride (4), which is grown laterally onto the bottom mask layer but confined and protected by the top mask layer to avoid cross-deposition.
Figure 3:
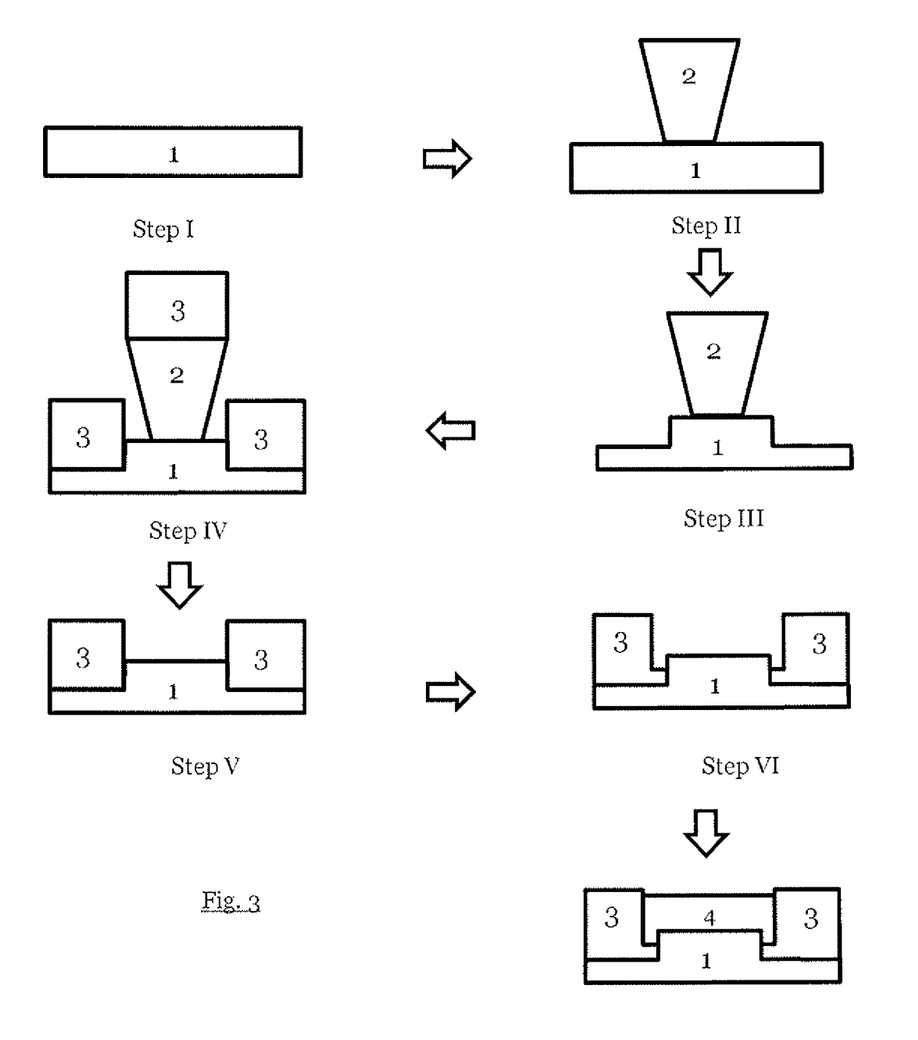
FIG. 3 schematically shows a process for forming a mask that allows ELOG growth to occur within it: base plate (1); negative photoresist (2); mask layer (3); and III-nitride with overgrown III-nitride (4).

ELOG growth has to occur during the growth of said drain. Hence, purposed-designed growth masks are used as shown in FIGS. 2 and 3. Each kind of mask has two widths: one is for the exposure of template and another one, which is larger, is to define the final width of said drain, as well as those of said insulation layer and said source. The width can change from one to another continuously or/and in step. So, during the growth inside these masks under ELOG growth conditions, said drain grows not only vertically, but also laterally until it fills up the opening window laterally.

Hereafter, those masks are referred as "double width growth mask" and FIGS. 2 and 3 show two typical fabrication processes. One fabrication process (FIG. 2) involves the use of two layers of mask materials that have different etching rates at the same conditions, comprising: I) providing a base plate; II) depositing a bi-layer mask in which the top layer has a large etching rate that that at the bottom in the same etching solution; III) Forming strips of opening windows to expose the surface of said base plate; IV) dipping into the solution for further lateral etching. So, more of the top layer is etched laterally. For example, the top layer is $SiO_2$ that is deposited with electron beam evaporation and the bottom layer is $Si_3N_4$ that is deposited at a high temperature, and has a smaller etching rate than the $SiO_2$ in a HF solution.

Another fabrication process (shown in FIG. 3) involves etching into a template, comprising: I) providing a base plate; II) defining the width of opening windows with a negative photoresist, which is also used for ICP etching of said base plate and following lift-off; III) etching into a template by a depth that is more than the width of planned ELOG-grown III-nitride; IV) depositing mask material; V) lift-off; VI) dipping into an etching solution to etch the mask material vertically and laterally.

$SiO_2$ and $Si_xN$ are suitable for these growth masks. But Si atoms in these materials could diffuse into the side faces of said drain, said insulation layer and said sources, with which a growth mask is on close contact. So, there could be a leakage current on the side face of said insulation layer. There are two solutions for this problem: 1) removal of a few nanometers of the materials on the side faces with ion bombardments or thermal treatment under Cl2 gas at above 60° C.; 2) covering the side wall of the growth mask with metals such as W.

ELOG growth conditions vary with the model of a MOVPE reactor. But in general, they include a relatively high growth temperature, a relatively high ammonia flow and a relatively low growth pressure. On the other hand, to encourage a vertical growth rate, the conditions include a relatively low growth temperature, a relatively low ammonia flow and a relatively high growth pressure.

Said vertical nitride stack always undergoes an ELOG growth process since it is formed by overlaying said mask layer. During its growth process, deposition could occur on top of the source but it can be etched away during device fabrication.

For some embodiments of this invention, before the growth of said vertical nitride stack, indiscriminate techniques such as thermal annealing with or without $Cl_2$ at above 60° C. and ion-beam bombardment may be used to optimise the side faces.

The fabrication processes for forming a functioning transistor comprise conventional photolithography, deposition of metals for electrodes, deposition of insulation layers for edge terms, and inductively coupled plasma (ICP) etching. In some cases, in order to minimize a gate leakage current, an insulation dielectric layer ($SiO_2$ or $Si_xN$) of ~10 nm to 30 nm is deposited on to the side face of said vertical nitride stack before the deposition of a gate electrode.

Figure 4:
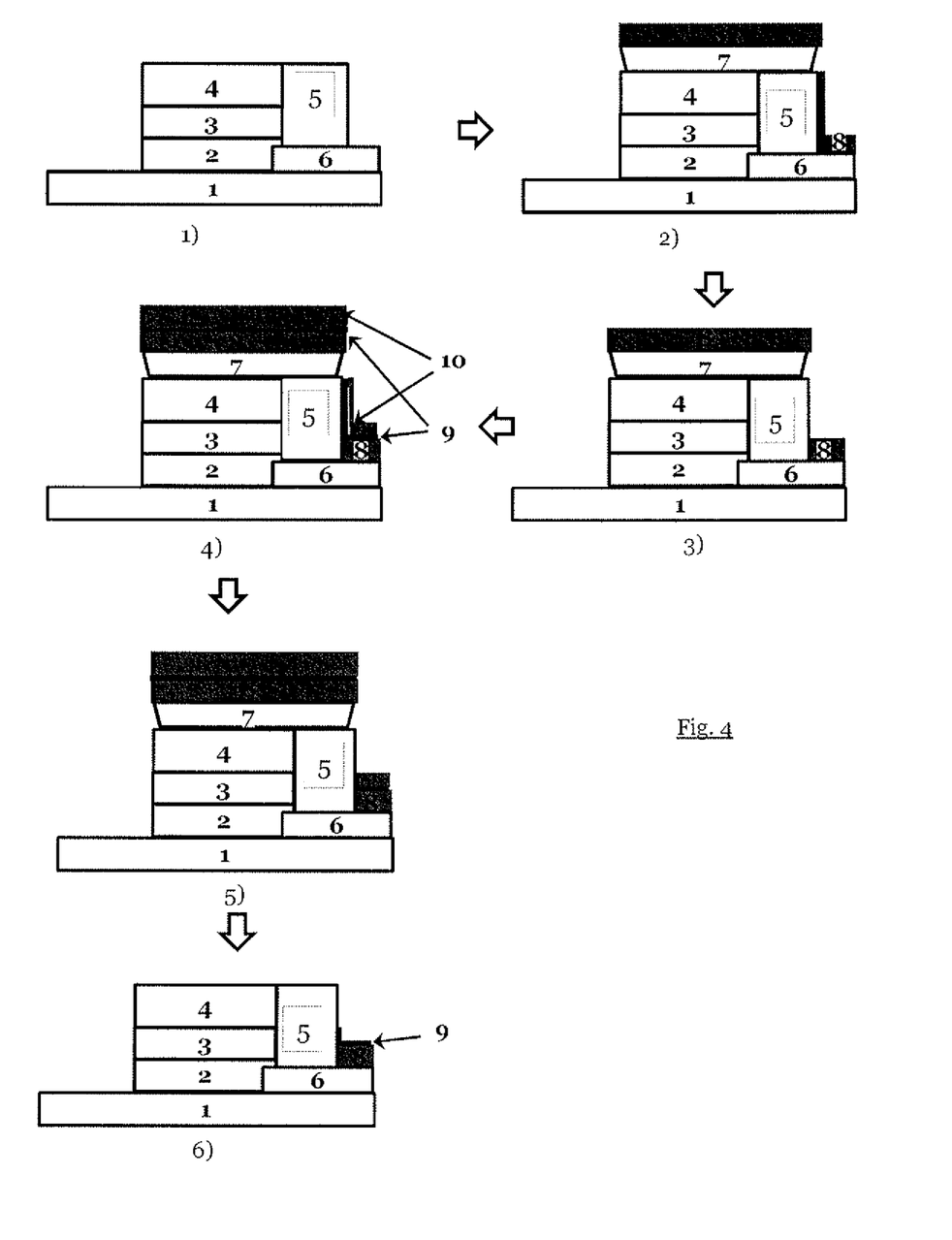
FIG. 4 schematically shows a process for forming a narrow gate electrode: base plate (1); drain (2); insulation layer (3); source (4); vertical nitride stack (5); mask layer (6); negative photoresist (7); first control layer (8); gate electrode (9); second control layer (10).

Near all transistors can benefit from a narrow gate electrode (down to 100 nm) since a narrow gate gives rise to a low current leak and a small gate capacitance. Such an electrode is difficult or expensive to make for traditional transistors since electron beam lithography has to be used, which is slow and of a high cost. However, for the embodiments of this invention, a narrow gate electrode can be easily made, as illustrated in FIG. 4. So, a third aspect of this invention provides a process for the reduction of gate vertical length on a vertical side face, comprising:

providing an as-grown device comprising a vertical conducting channel near and in parallel with a vertical face;
depositing a first control layer preferably on the horizontal surface which the vertical conducting channel is normal to;
removing first control layer on the vertical face;
disposing a gate electrode on the vertical face and the horizontal surface of first control layer;
disposing a second control layer preferably on the horizontal surface than on the vertical face of the gate electrode;
removing second control layer on the vertical surface to expose part of gate electrode; and
removing the exposed gate electrode.

In some embodiments of this invention, the first and the second control layers are deposited by one of these methods such as electron beam evaporation, thermal evaporation and sputtering.

During deposition, an as-grown device faces the source materials of the control layers at an angle to realise a higher deposition rate on said horizontal surface than on said vertical surface by a factor of more than two.

Consequently, distance from the gate to the drain is equivalent to the thickness of the first control layer that remains; and the gate length is equivalent to the thickness of the second control layer that remains.

Solution etching, ICP etching or the combination of both are used to remove the control layers and the exposed gate electrode. If the second control layer is conducting, it can stay to be used for electrical connection. Otherwise, it has to be removed to expose the gate metal on the horizontal surface to form an electrical contact. The vertical surface may be passivated with an insulation layer such as $SiO_2$ or $Si_xN$ before the final removal of the second control layer.

5. DESCRIPTION OF THE EMBODIMENTS

1. Case 1

Figure 5:
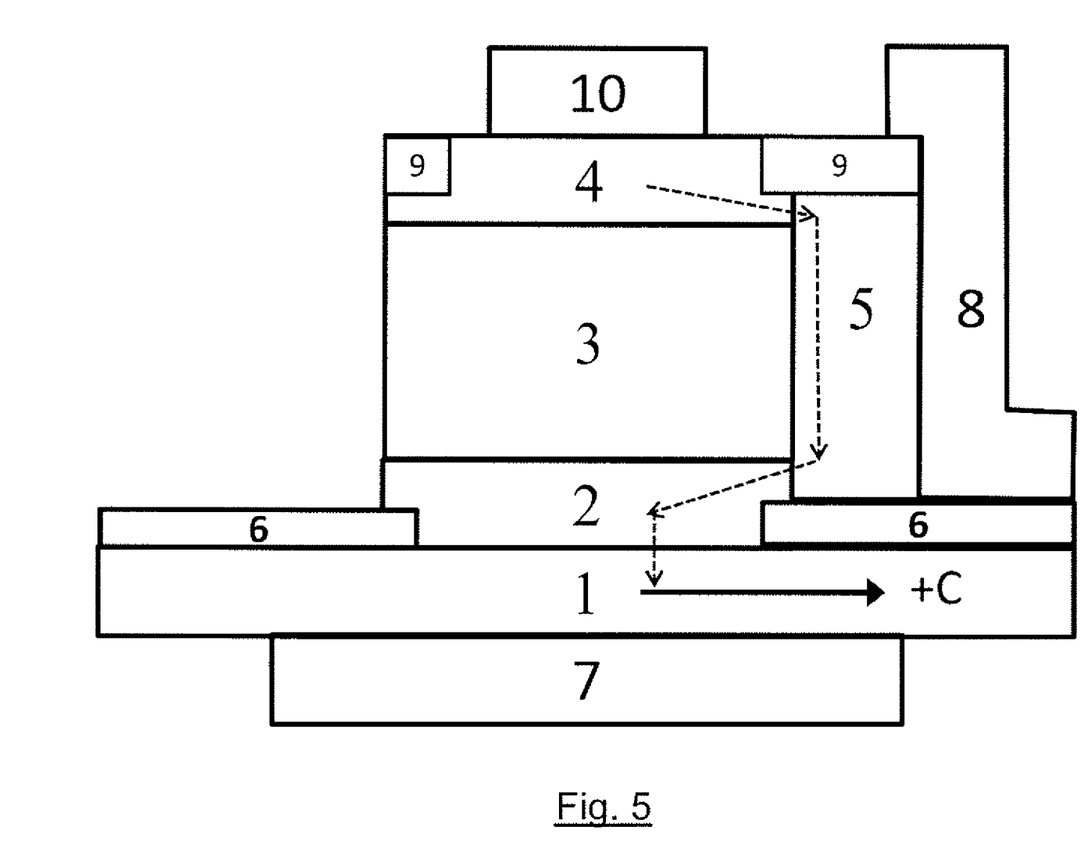
FIG. 5 schematically shows a cross-section view of a VFET in accordance with an embodiment of the present invention, having a Mg-doped, semi-insulating GaN as an insulation layer, which comprises: non-polar Si:GaN (1) as base plate; Si:GaN (2) as drain; semi-insulating Mg-doped semi-insulating GaN (3) as insulation layer; Si:GaN (4) as source; GaN/AlN/$Al_{0.23}Ga_{0.77}N$ (5) as vertical III-nitride stack; dielectric layer $Si_3N_4$ (6) as mask layer; drain electrode (7); gate electrode (8); edge terms (9); source electrode (10).

I) FIG. 5 schematically shows the cross-section of a device that comprises:

a non-polar (11-20) Si:GaN free-standing (FS) substrate (0.4 mm thick) that acts a base plate with its +C direction (i.e. [0001]) parallel its top polished surface; since such a template is expensive, non-polar III-nitride templates grown by MOVPE or MBE on a number of foreign substrates such as Si, Sapphire, SiC etc can also be used. Although there is a high density of defects in the nitride layers, the defects cannot penetrate a conducting channel with the methods provided by this invention. Hence, the electron mobility of the conducting channel is guaranteed. C-plane nitrides, either FS substrates or templates grown on foreign substrates, may also be used; but 2DEG is not available and n-type doped InGaN can be used for the vertical nitride stack as alternative conducting channels;

a mask layer consisting of a high-temperature $Si_3N_4$ layer (400 nm) and has strip-shaped opening windows of 50 μm along [0001] and 250 μm along [1-100] ([1-100] is normal to the cross-section) to define the bottom size of the drain and to separate the gate region from the base; Other mask materials prepared at a lower temperature (<600° C.) such as $SiO_2$, $Si_xN$, spin-on-glass, spin-on-dielectric, Ti, carbon, W, and flowable oxide are easy to make to be used as a mask layer. They have a high etching rate in a HF solution; but this issue has been addressed by providing two methods (FIGS. 2 and 3) for the fabrication of double-width masks to accommodate the possible device growth processes. The opening windows can be as long as the dimension of the base plate, and in this case, device fabrication involves an isolation process to divide a long strip into individual devices. For non-polar and C-plane templates, the opening windows are oriented so that the resulting side face can have a high growth rate;

a drain consisting of a layer of Si:GaN (1.5 μm, doping concentration: $2\times10^{+18}$ $cm^{-3}$) that has ELOG-grown Si:GaN on Ga-face side (~1 μm); $Si:Al_xGa_{1-x}N$ ($0 \le x \le 0.4$) may also be used as a replacement; but $Si:In_xGa_{1-x}N$ is advantageous since it is more conductive than Si:GaN and $Si:Al_xGa_{1-x}N$;

an insulation layer that consists of a Mg-doped semi-insulating GaN layer (4 μm, resistivity: ~$10^{+7}$ Ω·cm, Mg-doping concentration: $6-9\times10^{17}$ $cm^{-3}$) grown on the Si:GaN drain layer; Unintentionally-doped (UID) GaN can also be used as an insulation layer. Although it is not so resistive as Mg:GaN, avoided is the potential Mg diffusion into a conducting channel that could reduce the electron mobility. Further, $Al_xGa_{1-x}N$ ($0 \le x \le 0.4$) may also be used as a replacement, provided that a UID GaN layer in a vertical nitride stack, which will grow onto the side face of the insulation layer, is fully relaxed;

a Si:GaN layer (2 μm) on top of the insulation layer as source; It can has the same alternatives as the drain; but it tope surface may be finished with a ~10 nm highly-doped Si:GaN (~$5\times10^{+19}$ $cm^{-3}$) to reduce the metal-GaN contact resistance; and a vertical nitride stack that consists of a UID GaN layer (~30 nm) to optimise the Ga-faces (i.e. side face) of the drain, the insulation layer and the source, a layer of AlN (1 nm) and an $Al_{0.25}Ga_{0.75}N$ layer (30 nm) barrier layer. So, a 2DEG conducting channel is formed at the interface between the UID GaN and the barrier layer. The UID GaN may be replaced with Si:GaN (~$2\times10^{+18}$ $cm^{-3}$) to reduce the serial resistance between the conducting channel and the drain and that between the conducting channel and the source. Instead of a 2DEG conducting channel, $Si:In_xGa_{1-x}N$ can also be used as a conducting channel.

There are also associated parts such as edge terms that consists of $SiO_2$, and all the necessary electrodes that include a drain electrode on the base plate, a source electrode on top of the source and a gate electrode (or a gate) on the vertical nitride stack.

This device operates like this: When a high voltage is applied between the source and the drain, electrons can be driven to flow from the source to the drain through the 2DEG conductive channel that is filled with electrons. So, it is a normally-on transistor. In order to turn the transistor off, a negative voltage (~8 V) is needed to apply to the gate or the vertical nitride stack to deplete the electrons in the conductive channel and consequently, the electrons from the source cannot reach the drain. So, it behaves as a switch controlled by a voltage.

But it can become a normally-off device when the insulation layer consists of AlN (5 nm)/Mg:GaN (~300 nm, doping concentration: $4\times10^{+19}$ $cm^{-3}$)/AlN (5 nm). The Mg:GaN depletes the 2DEG gas at the interface locally. In this case, a positive voltage is needed to apply onto the Mg:GaN layer to turn on the transistor.

Figure 6:
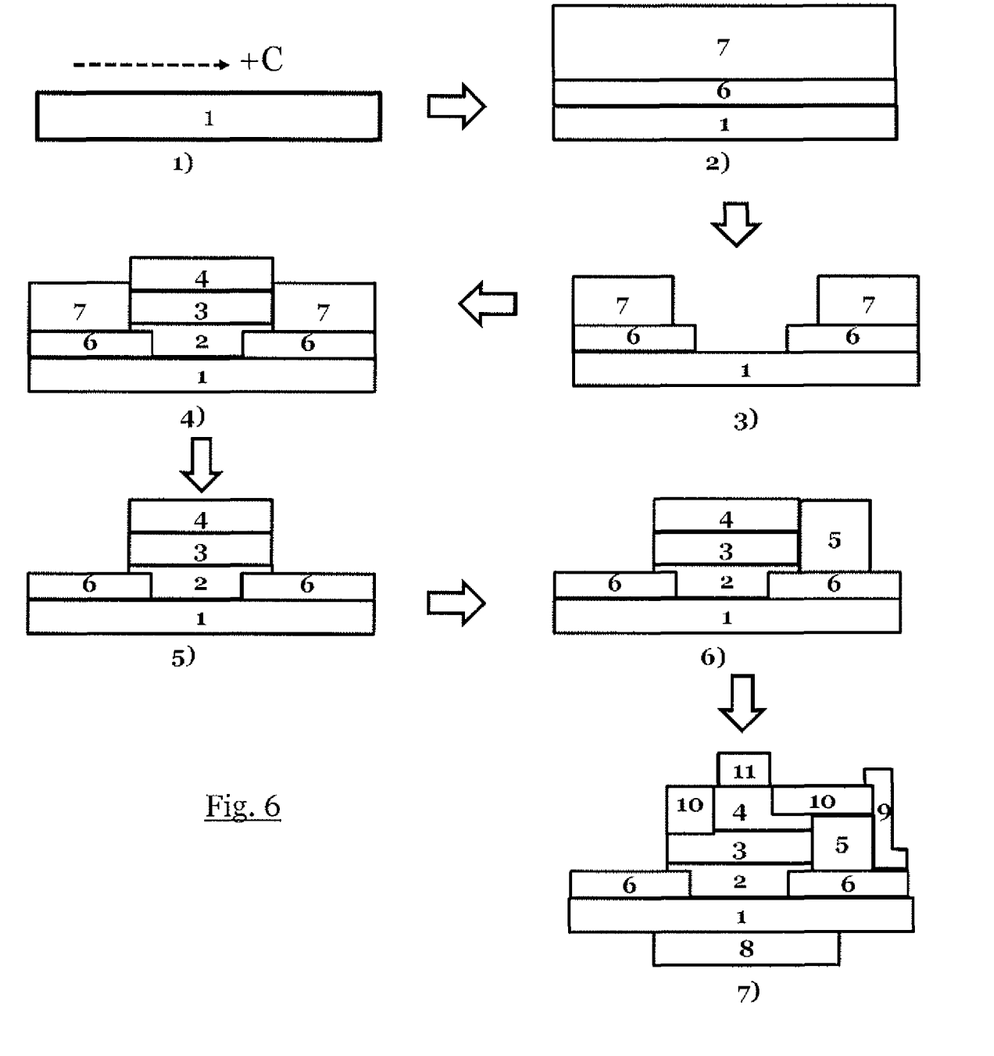
FIG. 6 shows a flow chart showing a formation process for a VFET with a Mg-doped semi-insulating GaN as an insulation layer: non-polar Si:GaN (1) as base plate; Si:GaN (2) as drain; semi-insulating Mg-doped GaN (3) insulation layer; Si:GaN (4) as source; GaN/AlN/$Al_{0.25}Ga_{0.75}N$ (5) as vertical nitride stack. $Si_3N_4$ (6) and $SiO_2$ (6a) as mask layer; drain electrode (7); gate electrode (8); edge terms (9); source electrode (10).

II) A formation process for such a structure is illustrated in FIG. 6:

1) Providing a FS Si:GaN non-polar (11-20) wafer (Si doping concentration: >$8\times10^{17}$ $cm^{-3}$). Since it is conductive, one side of the wafer can be used for electrode formation and the other side is used for the formation of device structure. Since FS wafers are expensive, a template consisting of non-polar (11-20) Si:GaN layer (~2.0 μm) grown on a (1102) sapphire substrate may be used and in such a case, the drain electrode and the device are on the same side of the template.

2) Depositing a high-temperature dielectric $Si_3N_4$ layer of 400 nm on the wafer in a MOVPE reactor, followed by a $SiO_2$ layer of ~5 μm with electron beam evaporation. These materials have good adhesion to GaN surface and are often stress free. But the former has a smaller etching rate in a BOE (buffer-oxide-etching, mixture of HF and $NH_4F$) solution.

3) Opening rectangular opening windows (50 μm×250 μm) with ICP (Inductively Coupled Plasma) etching to expose the Si:GaN substrate surface. This process also involves fabrication of a Cr etching mask (~200 nm thick) with a lift-off process. Finally, the template is dipped into a BOE solution to etch the $SiO_2$ layer laterally by ~300 nm whilst the $Si_3N_4$ is hardly etched, as shown in FIG. 2. So, a double width growth mask is formed.

4) Inside opening windows, first growing Si:GaN as the drain with ELOG growth conditions (i.e. high-temperature, low-pressure and a high ammonia flow) to make sure that its side Ga-face is confined by the double width mask, then grow Mg-lightly-doped GaN as the insulation layer and part of the source (Si:GaN), and finally grow the rest of the source vertically above the mask layer using vertical growth conditions such as relatively low ammonia flow, a relatively high pressure and a relatively low temperature. The source and the drain are doped with Si (~$4\times10^{+18}$ $cm^{-3}$). The insulation layer is doped lightly with Mg (~$6\times10^{+17}$ $cm^{-3}$) to neutralize the background electrons to form a semi-insulating III-nitride and other dopants such as C or/and Fe may also be used.

5) Dissolving the $SiO_2$ in a HF:$NHF_3$:$H_2O$ buffer-oxide-etching (BOE) solution to expose the side faces of the drain, the source and the insulation layer, and most of the $Si_3N_4$ layer remains due to the etching selectivity between electron-beam-evaporated $SiO_2$ and high-temperature $Si_3N_4$. This process can also be carried out with ICP etching. The remaining $Si_3N_4$ layer is used not only as a growth mask for the growth of the vertical nitride stack but also as the insulation layer between a gate electrode and the drain.

6) Treating the side faces of the insulation layer, the source and the drain in an ICP etcher at 120° C. with a Cl2 gas purge to remove Si contaminated surface layer.

7) Growing a GaN buffer layer (~30 nm) on the Ga-face with ELOG growth conditions to optimise the electron mobility in the channel, followed by depositing a layer of AlN (1 nm) and an $Al_{0.25}Ga_{0.75}N$ barrier layer (30 nm). The GaN layer cannot be thick since it will increase the serial resistance. So, a 2DEG of free electrons and a 2DEG conducting channel are formed. There will be some deposition on the top of the source during this process, but it can be etched away with ICP etching during forming electrodes and edge terms.

8) Device fabrication: The process, in general, comprises: a) mesa and isolation formation with ICP etching and filling the gap with $SiO_2$ to establish individual device region; b) edge term etching and filling up with $SiO_2$; c) Spin-coating of negative photoresist, exposing the gate side face and the insulation layer, and depositing a gate electrode; In order to reduce the possible gate leakage current, a layer of $SiO_2$ layer may be deposited onto the side face of the vertical nitride stack with electron beam evaporation before a gate electrode is deposited. d) forming a source electrode; e) forming a drain electrode.

9) Packaging: This may comprise a process of clamping or depositing heat conductive materials such as Cu, diamond etc, to extract the heat.

2. Case 2

Figure 7:
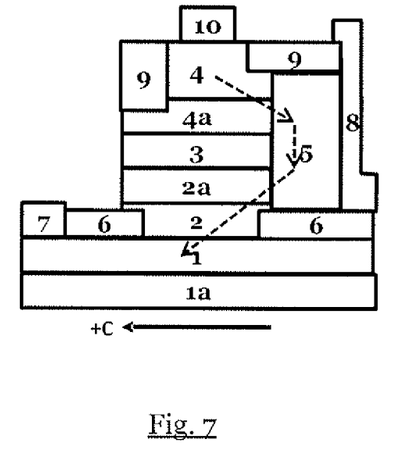
FIG. 7 schematically shows a VFET in accordance with an embodiment of the present invention that has a 2DEG conducting channel on N-face and a layer of $Al_{0.25}Ga_{0.75}N$ as an insulation layer: Si:GaN (1) on R-plane sapphire substrate (1a) as base plate; Si:GaN (2) and Si:$Al_{0.15}Ga_{0.85}N$ (2a) as drain; $Al_{0.25}Ga_{0.75}N$ (3) as insulation layer; Si:$Al_{0.15}Ga_{0.85}N$ (4a) and Si:GaN (4) as source; $Al_{0.25}Ga_{0.75}N$ (3 nm)/AlN (1 nm)/GaN (30 nm) (5) as vertical III-nitride stack; $SiO_2$ (6) as insulation layer; drain electrode (7); gate electrode (8); edge terms (9); source electrode (10).

1) FIG. 7 schematically shows the cross-section of another embodiment that has an AlGaN layer as an insulation layer due to its wide band-gap and high resistivity and a vertical nitride stack on the N-face. In detail, it comprises:

a base plate comprising a non-polar (11-20) Si:GaN layer (4.5 μm, doping concentration: $4 \times 10^{+18}$ cm$^{-3}$), which is grown by MOVPE on a R-plane sapphire substrate; In order to form an ohmic contact for the drain electrode, the top surface of the Si:GaN layer may be highly doped (~$4 \times 10^{+19}$ cm$^{-3}$);

a drain (bottom size: 50 μm×250 μm) comprising a Si:GaN layer of ~1 μm and a Si:Al$_{0.15}$Ga$_{0.85}$N layer (0.3 μm, doping concentration: $8 \times 10^{+18}$ cm$^{-3}$), which have overgrown GaN and AlGaN (200 nm) on the N-face side;

an Al$_{0.25}$Ga$_{0.75}$N layer (3.5 μm) as an insulation layer;

a source comprising a Si:Al$_{0.15}$Ga$_{0.85}$N layer (0.2 μm) and a Si:GaN layer (2.0 μm) on top of the insulation layer;

a vertical nitride stack comprising an Al$_{0.25}$Ga$_{0.75}$N of ~3 nm, an AlN layer of ~1 nm and a channel layer of GaN (~30 nm) on the N-face; 6) a $SiO_2$ layer (1 μm) to separate the gate layer from the base.

There are also edge terms that consist of $SiO_2$, all the necessary electrodes. So, inside vertical nitride stack, there is a conducting channel between the Al$_{0.25}$Ga$_{0.75}$N layer and the GaN channel layer, extending to both the source and the drain by using two Si:Al$_{0.15}$Ga$_{0.85}$N layers, respectively, to eliminate the "hotspots".

This device operates like this: when a high voltage is applied between the source and the drain, electrons flow from Si:GaN of the source to Si:Al$_{0.15}$Ga$_{0.85}$N of the source, to the 2DEG conducting channel, to the Si:Al$_{0.15}$Ga$_{0.85}$N of the drain and finally to Si:GaN of the drain. To turn off the device, a negative voltage is applied to push electrons towards the AlGaN insulation layer. So, it behaves as a switch that is controlled by a voltage.

But it can become a normally-off device when the insulation layer consists of AlN (5 nm)/Mg:Al$_{0.25}$Ga$_{0.75}$N (~300 nm, doping concentration: $4 \times 10^{+19}$ cm$^{-3}$)/AlN (5 nm). The Mg:Al$_{0.25}$Ga$_{0.75}$N depletes the 2DEG gas at the interface locally. In this case, a positive voltage is needed to apply onto the Mg:Al$_{0.25}$Ga$_{0.75}$N layer to turn on the transistor.

A process for forming the device comprising:

1) Providing a base plate that comprises a layer of (11-20) Si:GaN (4 μm, doping concentration: $4 \times 10^{+18}$ cm$^{-3}$) grown on a R-plane sapphire substrate.

2) Forming a double-width mask layer with opening windows (50 μm×250 μm). The longest edge of the windows is oriented 4° away from the (1-100) direction. The double width growth mask is formed with these procedures: i) spin-coating a layer of negative photoresist (~8.0 μm) and exposing the region with photolithography where the $SiO_2$ will be deposited; ii) etching into the Si:GaN layer by a depth of ~1 μm with ICP etching and the negative photoresist as the etching mask; iii) depositing $SiO_2$ (~7.0 μm) with electron beam evaporation; iv) conducting a lift-off process to expose the intact (11-20) template surface for further growth of the drain; and v) dipping the sample into a solution BOE (2o:1) for 4 minutes so that the opening windows are enlarged by ~300 nm on all sides. Finally, the sample is loaded into an electron beam evaporator so that 90% of the side wall of the mask faces a tungsten (W) source crucible whilst the surface of the base plate is shaded, and a layer of W (~50 nm) is deposited.

3) Growing a layer of Si:GaN (0.5 □m) and a layer of Si:Al$_{0.15}$Ga$_{0.85}$N (0.5 μm) to complete drain with an ELOG process, i.e. it grows both vertically along [11-20] and horizontally along –C (i.e. [000-1], normal to N-face) by employing such conditions as a relatively high growth temperature, a relatively low reactor pressure and a relatively high ammonia flow (which depend on model of MOVPE reactor).

4) Growing the Al$_{0.25}$Ga$_{0.75}$N insulation layer (3.5 μm) and the Si:Al$_{0.15}$Ga$_{0.85}$N (200 nm) of the source inside the double width mask layer with ELOG growth conditions.

5) Growing a Si:GaN vertically to complete the drain. The growth conditions include a relatively low growth temperature, a relatively high reactor pressure and a relatively low ammonia flow.

6) Dipping the as-grown sample into a solution BOE (5:1) to reduce the thickness of growth (SiO2) to ~1 μm.

7) Growing an Al$_{0.25}$Ga$_{0.75}$N of ~3 nm, an AlN layer of ~1 nm on the N-face and a GaN layer (30 nm) onto the N-face to complete the structures.

8) Fabricating devices with a common process.

3. Case 3

A narrow gate electrode (~800 nm) can be easily made, as illustrated in FIG. 4 whilst the control layers are $SiO_2$ and the gate electrode is Ni/Au. The process comprises:

i. providing an as-grown device structure which is shown in FIG. 7;

ii. depositing a $SiO_2$ layer as a first control layer on the gate side by: I) covering the device structure with negative photoresist; 2) exposing the N-face that has the vertical nitride stack with a photolithographic process; iii) depositing $SiO_2$ (3 μm thick) with electron beam evaporation. During the evaporation, the mask layer (hereafter the horizontal surface) faces directly toward a $SiO_2$ source crucible. So the $SiO_2$ layer that is deposited on the horizontal surface is much thicker than the layer of $SiO_2$ (<200 nm) that is deposited on the N-face face of vertical nitride stack (the vertical surface);

iii. removing the $SiO_2$ on the vertical surface in a 10:1 BOE solution by controlling etching time (a few minutes). The $SiO_2$ layer on the horizontal surface is also etched with a similar thickness, but it could be ~2.5 μm. This layer controls the distance from the gate edge to the drain;

iv. depositing a gate electrode (such as Ni (20 nm)/Au (100 nm)) in a multi-crucible electron beam evaporator. During evaporation, the sample is tilted so that both the vertical surface and the horizontal surface face the crucibles at angles of ~45°. Consequently, the metal layer on the horizontal surface is nearly equivalent to what is on the vertical surface.

v. repeat step 2 except that the thickness of SiO2 is reduced by a half;

vi. exposing the top part of the gate electrode with ICP etching when the sample is tilted by an angle of ~15° not only to remove the $SiO_2$ on the vertical surface, but also to thin the $SiO_2$ on the horizontal surface to ~800 nm;

vii. removing the exposed electrode in an aqua regia solution; and viii. removing the photoresist, as well as the $SiO_2$ and metals on top of the device through a so-called "lift-off" process.

The invention claimed is:

1. A III-nitride vertical field effect transistor comprising:
   a base plate;
   a mask layer overlaying said base plate and having opening windows for partial exposure of said base plate, said mask layer having a top surface;
   a drain grown epitaxially from the opening windows of said mask layer onto said base plate, said drain having a top surface and a side face;
   an insulation layer grown epitaxially onto said drain top surface, said insulation layer having a top surface and a side face;
   a source grown epitaxially onto said insulation layer top surface, said source having a top surface and a side face;
   a vertical nitride stack grown epitaxially onto the side face of said drain, said insulation layer and said source, such that the stack overlies said mask layer, the stack providing a conducting channel connecting said source and said drain, wherein said conducting channel terminates on said top surface of said mask layer; and
   a source electrode, a drain electrode and a gate electrode are in contact or in series with said source, said drain and said vertical nitride stack, respectively.

2. The vertical field effect transistor according to claim 1, wherein the drain at least partially overlies the mask layer.

3. The vertical field effect transistor according to claim 1, wherein said mask layer comprises at least one of $SiO_2$, $Si_xN$, spin-on-glass, spin-on-dielectric, Ti, W, carbon and flowable oxide.

4. The vertical field effect transistor according to claim 1, wherein said drain comprises at least one of $In_yAl_xGa_{1-x-y}N$ where $0 \leq y \leq 0.4$ and $0 \leq x \leq 0.4$ with a n-type doping concentration of $1 \times 10^{17}$ cm$^{-3}$ to $3 \times 10^{20}$ cm$^{-3}$.

5. The vertical field effect transistor according to claim 1, wherein said insulation layer comprises at least one of $In_yAl_xGa_{1-x-y}N$ where $0 \leq y \leq 0.2$ and $0 \leq x \leq 1$, and has a thickness of 300 nm to 30 µm.

6. The vertical field effect transistor according to claim 1, wherein said source comprises at least one of $In_yAl_xGa_{1-x-y}N$, where $0 \leq y \leq 0.4$, $0 \leq x \leq 0.4$, with a n-type doping concentration of $1 \times 10^{17}$ cm$^{-3}$ to $3 \times 10^{20}$ cm$^{-3}$.

7. The vertical field effect transistor according to claim 1, wherein said vertical nitride stack comprises at least one layer of n-type where $0 \leq x \leq 0.4$ as a conducting channel, which has a thickness of 20 nm to 300 nm, and a n-type doping concentration of $1 \times 10^{15}$ cm$^{-3}$ to $1 \times 10^{20}$ cm$^{-3}$.

8. The vertical field effect transistor according to claim 1, wherein said vertical nitride stack provides at least one vertical 2-dimensional electron gas conducting channel by comprising at least one layer of $In_yAl_xGa_{1-x-y}N$ where $0 \leq y \leq 0.4$, $0 \leq x \leq 1$, which is between 0.5 nm to 100 nm in thickness, when said drain, said insulation layer and said source comprises non-polar nitride layers.

9. The vertical field effect transistor according to claim 1, said drain electrode is on top side of said base plate.

10. The vertical field effect transistor according to claim 1, said drain electrode is on back side of said base plate.

11. The vertical field effect transistor according to claim 1, the vertical location of said gate electrode is below the boundary between said source and said insulation layer, and above the boundary between said insulation layer and said drain.

* * * * *